(12) United States Patent
Srinivasan et al.

(10) Patent No.: US 6,747,589 B2
(45) Date of Patent: Jun. 8, 2004

(54) ERROR CORRECTION ARCHITECTURE TO INCREASE SPEED AND RELAX CURRENT DRIVE REQUIREMENTS OF SAR ADC

(75) Inventors: Chakravarthy Srinivasan, Karnataka (IN); Kiran M. Godbole, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 162 days.

(21) Appl. No.: 10/152,423

(22) Filed: May 21, 2002

(65) Prior Publication Data

US 2003/0123646 A1 Jul. 3, 2003

Related U.S. Application Data

(60) Provisional application No. 60/343,738, filed on Dec. 28, 2001.

(51) Int. Cl.[7] .............................. H03M 1/12; H03M 1/34
(52) U.S. Cl. ........................................ 341/172; 341/163
(58) Field of Search ................................ 341/172, 144, 341/155, 163

(56) References Cited

U.S. PATENT DOCUMENTS

4,620,179 A    10/1986  Cooper et al. .............. 341/156

*Primary Examiner*—Jean Jeanglaude
(74) *Attorney, Agent, or Firm*—W. Daniel Swayze, Jr.; W. James Brady; Frederick J. Telecky, Jr.

(57) ABSTRACT

An SAR ADC is operated by sampling an input voltage and redistributing a corresponding charge among the coupling capacitor and a plurality of binarily weighted capacitors of a CDAC array to produce a first voltage on a charge summing conductor. A successive approximation bit testing/conversion operation is performed at a first speed on a first group of bits, beginning with the MSB, to determine the bits of the first group with at least a first level of accuracy. A first error correction operation includes performing a bit testing/conversion operation on a last bit of the first group at a second speed which is lower than the first speed to determine the bits of the first group at least a second level of accuracy which is more accurate than the first level of accuracy. Both the voltage on the charge summing conductor and the bits of the group are incremented or decremented as necessary to elevate the level of accuracy of bits of the first group to at least the second level of accuracy.

28 Claims, 4 Drawing Sheets

ERROR CORRECTION ARCHITECTURE TO INCREASE SPEED AND RELAX CURRENT DRIVE REQUIREMENTS OF SAR ADC

This application claims the benefit of prior filed U.S. provisional application Serial No. 60/343,738 filed Dec. 28, 2001 and entitled "ERROR CORRECTION ARCHITECTURE TO INCREASE SPEED AND RELAX CURRENT DRIVE REQUIREMENTS OF SAR ADC" by Chakravarthy Srinivasan and Kiran M. Godbole.

BACKGROUND OF THE INVENTION

The present invention relates generally to high speed, low-power SAR (successive approximation register) ADCs (analog-to-digital converters), and more particularly to an improved technique for operating an SAR ADC of generally conventional architecture to increase its conversion speed with little modification to its architecture or circuitry.

Figure 1:
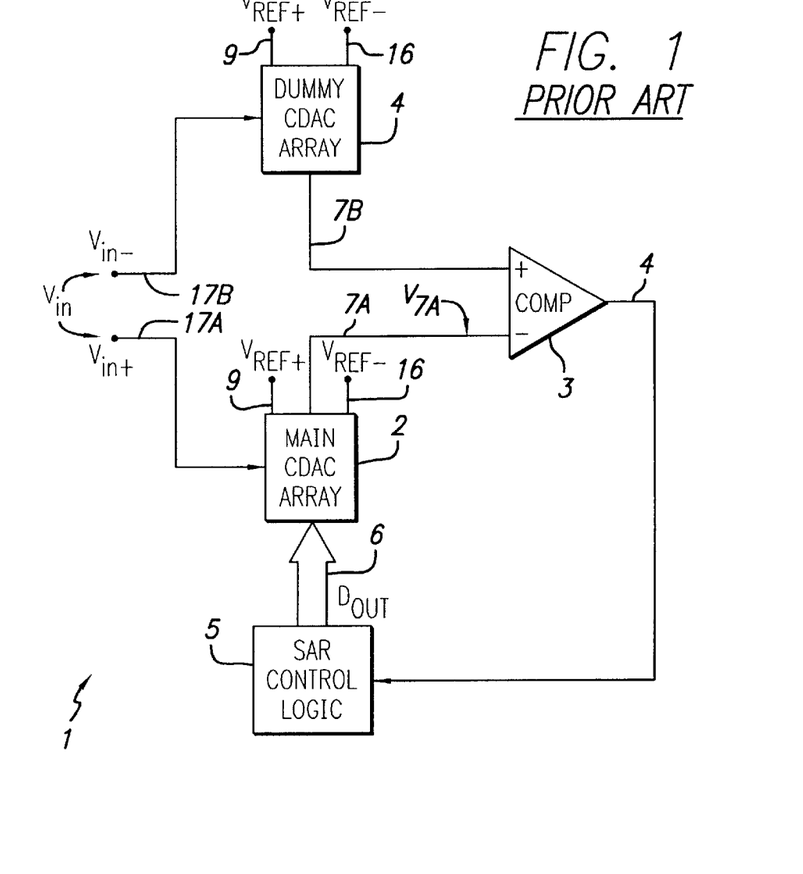
FIG. 1 is a block diagram of a conventional SAR ADC.

The basic conventional SAR ADC architecture is shown in FIG. 1, wherein a conventional CDAC (capacitive digital-to-analog converter) capacitor array 2 typically is connected to a charge summing conductor 7A which is connected to the one of the inputs of a comparator 3. The other input of comparator 3 is connected to a charge summing conductor 7B of a conventional "dummy" CDAC capacitor array 4. The output 4 of comparator 3 is connected to an input of a conventional SAR control logic circuit 5, which produces a plurality of digital output signals Dout on a digital bus 6 that is coupled to transistor switches in CDAC capacitor array 2. The transistor switches selectively couple the various capacitors in CDAC capacitor array 2 to a reference voltage conductor 9 conducting a reference voltage $V_{REF+}$ or to a reference voltage conductor 16 conducting a reference voltage $V_{REF-}$, which typically is ground.

Figure 2:
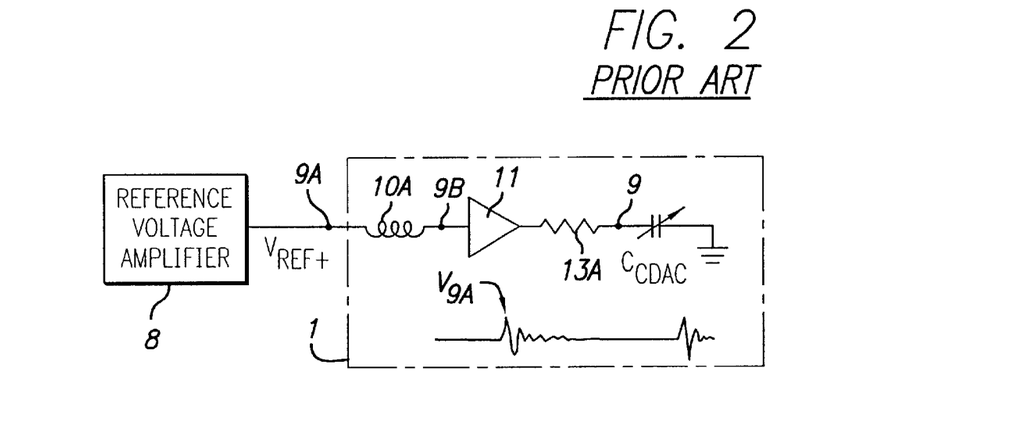
FIG. 2 is a schematic diagram of a conventional external reference voltage amplifier connected to a SAR ADC chip, showing an internal buffer circuit in the chip to isolate bonding wire inductance from an internal reference voltage conductor.

FIG. 2 shows a typical external reference voltage amplifier 8 which produces $V_{REF+}$ on conductor 9 within SAR ADC 1 of FIG. 1. There is a substantial bonding wire inductance 10A inside of an integrated circuit chip (indicated by the dashed line) on which the conventional SAR ADC 1 of FIG. 1 is formed. Inductance 10A is coupled between external conductor 9A and an internal conductor 9B conducting the internal value of $V_{REF+}$ which is applied by the transistor switches to the various capacitors of CDAC capacitor array 2 in accordance with digital signals Dout produced by SAR control logic 5 during the successive approximation testing/conversion operation. Reference numeral 13A in FIG. 2 represents series resistance of the transistor switch driving the CDAC, and conductor 9 and is shown as being lumped between node 9 and the output of an internal buffer 11.

Reference numeral 12 in FIG. 2 designates the widely variable capacitance $C_{CDAC}$ of the portion of CDAC capacitor array 2 which effectively "loads" reference voltage amplifier 8 during the successive approximation process. If internal buffer 11 is omitted, then waveform $V_{9A}$ in FIG. 2 indicates "ringing" of voltage that would be caused by bonding wire inductance 10A on conductor 9B when the CDAC array capacitance 12 varies suddenly due to switching that occurs in response to the digital signals 6 to establish the successive mid-range voltages needed for testing/conversion of each bit of the output word Dout.

Therefore, in the prior art it is usually necessary to provide above mentioned internal buffer circuit 11 to isolate the inductance 10A from the variable CDAC array capacitance 12 to avoid the kind of ringing indicated by waveform $V_{9A}$. For high resolution ADCs, the CDAC capacitance has to be large, to achieve good noise and matching performance. Therefore, the switching load on the reference buffer is high for high resolution devices. Also, the speed at which the conversion is done puts a constraint on the settling time of the buffer. All these factors together increase the power consumption of the buffer 11. Undesirably, such an internal buffer 11 occupies a substantial amount of chip area and consumes a substantial amount of power.

One of the main drawbacks of high speed SAR ADCs that utilize internal CDACs (capacitive digital-to-analog converters) is that the external reference voltage amplifier driving the CDAC is subjected to the above mentioned widely changing capacitive load, depending on the value of the digital output word being generated to represent the analog input signal Vin. Consequently, if N is large, e.g., 16 bits or more, a large amount of time has to be allowed for the reference voltage amplifier 8 to settle to an accuracy corresponding to the N bit output word being produced.

Figure 3:
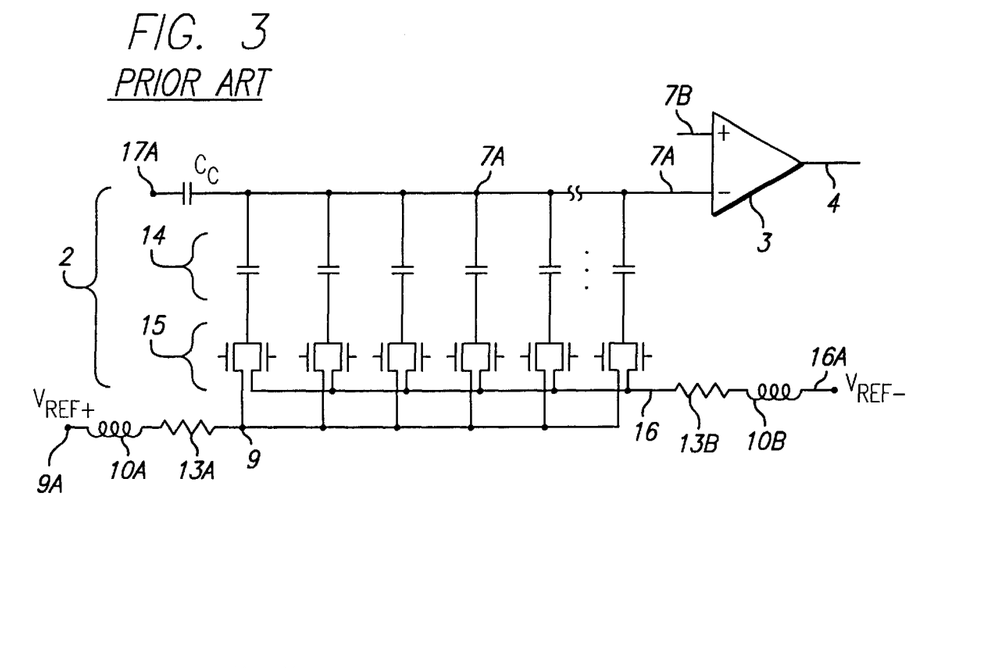
FIG. 3 is a block diagram useful in explaining a problem caused by reference voltage amplifier settling in conventional SAR ADCs.

FIG. 3 shows more details of CDAC capacitor array 2, wherein reference numeral 14 designates a plurality of binarily weighted CDAC array capacitors each having an upper terminal connected to charge summing conductor 7A and a lower terminal selectively coupled by a transistor switch circuit 15 to either $V_{REF+}$ or $V_{REF-}$ in response to the digital control signals 6 during the successive approximation bit testing/conversion procedure.

In the conventional SAR ADC 1 of FIG. 1, an analog input Vin=Vin±Vin− is applied between an input conductor 17A of CDAC capacitor array 2 and an input conductor 17B of dummy CDAC capacitor array 4. Vin+ and Vin− are sampled by means of input coupling capacitors in main CDAC array 2 and dummy CDAC array 4 during a sampling phase. At the end of the sampling phase, a conventional binary search algorithm is performed in response to the output of comparator 3 to establish a binary mid-range value for the output bit currently being tested/converted. Comparator 3 in effect compares the sampled analog input voltage to the present value of the binary mid-range value established in main CDAC array 2, and assigns a binary value of "1" to the bit presently being tested if the sampled analog input voltage exceeds the binary mid-range value, and otherwise assigns a binary "0" to the bit being tested/converted. As the conventional conversion process proceeds, it includes progressively testing and assigning "1" or "0" values to the output bits, one at a time, beginning with the MSB (most significant bit), to produce the output word Dout.

Each bit of the digital output word Dout, beginning with the MSB (most significant bit), is tested sequentially by comparator 3 to determine if that bit should be a "1" or a "0". For an N bit accuracy of the ADC, the comparator should be able to resolve the difference of (Vref/$2^N$) at its inputs. If N is increased, the comparator either (1) requires more time to settle, or (2) requires more bandwidth and consequently consumes more power if no more time is allowed for settling in order to resolve the more accurate bit testing decisions necessitated by the increasing of N.

In a typical SAR ADC, the analog to digital conversion proceeds one bit at a time until all of the bits of the digital output word are resolved, i.e., converted. All of the bits are processed at the full accuracy level required for an N-bit digital output word, so an equal amount of time is required to resolve each of the N bits of the output word Dout. Therefore, the amount of time required for a typical analog-to-digital conversion by an SAR ADC is:

$$Tcycle = Tsample + N*Tclock,$$

where Tclock is the time required for resolving any one of the N bits of the output word.

The design of high-speed, high-resolution SAR ADCs is substantially limited by the speed of the comparator 3, by the bandwidth/power/settling time of the external reference voltage amplifier 8, and the internal settling time of the charge summing conductor 7A of the CDAC array 2. The higher the resolution of the SAR ADC, the more stringent the limitations on the amount of noise that can be present in the comparator, and the higher the amount of CDAC switching capacitance that the reference voltage amplifier must drive as it settles. The higher the desired speed of analog-to-digital conversion, the higher the speed, bandwidth and power consumption of comparator 3 must be, and the less time is available during which the voltage reference amplifier 8 must settle to the required accuracy level during the successive approximation testing/conversion of each bit. The amount of time required for the internal CDAC charge summing conductor 7A to settle to the required accuracy level includes two components, including (1) an RC time constant which determines the amount of time required for charge redistribution along the charge summing conductor 7A, and (2) the amount of time required for settling of the internal reference voltage node 9B connected to the transistor switches 15 (FIG. 3) associated with the various binarily weighted capacitors of the CDAC.

To summarize, the main bottlenecks for achieving high-speed, low-power operation of an SAR ADC are the settling time of the reference voltage amplifier 8, the CDAC charge redistribution time for the charge summing conductor 7A, and the delay of the comparator 3. The output of external reference voltage amplifier 8 is coupled through bonding wire inductance to a switched CDAC load, so every time the CDAC capacitor array is switched for the next bit decision, there is a current surge that must be supplied by a reference voltage amplifier output. This causes RLC "ringing" of the reference voltage, which must be allowed to settle to an N-bit accuracy level, which for N equal to 16, is approximately 30 microvolts, and is approximately 0.5 millivolts at the 12 bit accuracy level. To avoid this ringing, the internal reference buffer 11 ordinarily is provided on the SAR ADC integrated circuit chip 1 to isolate the bonding wire inductance 10A and the CDAC capacitor array 12. Unfortunately, the internal reference buffer 11 requires a large amount of supply current in order to drive the large switched capacitive CDAC array loads 12 as the successive bits are tested/converted.

Apart from the settling of the reference voltage amplifier, the CDAC also requires additional time for charge redistribution before each successive bit of the output word can be tested. The charge redistribution time is an exponential settling time, and requires, for example, approximately 12 time constants to settle to the 16-bit accuracy level, 9 time constants to settle to the 12 bit accuracy level, and approximately 6.3 time constants to settle to the 8 bit accuracy level.

The comparator delay is the time required for the comparator to resolve the difference between the voltage applied between its inputs. This delay is inversely proportional to the minimum voltage difference that needs to be resolved, which in turn is proportional to the resolution of the ADC.

Figures 4A, 4B:
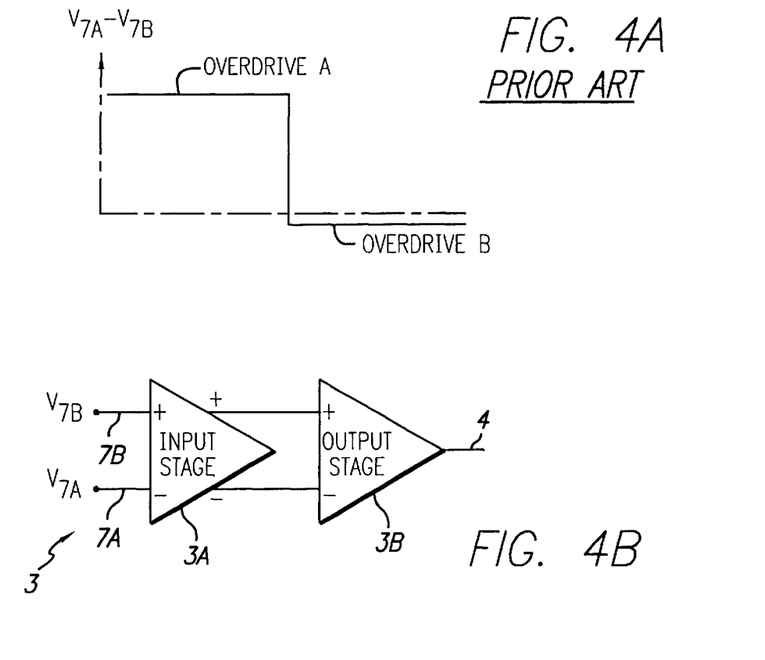
FIG. 4A is a graph useful in explaining comparator delay in conventional SAR ADCs.
FIG. 4B is a block diagram showing the input stage and output stage of the comparator in a conventional SAR ADC.

Referring to FIG. 4A, an example is shown of the voltage difference $V_{7A}-V_{7B}$ applied between the inputs of comparator 3 wherein a large value designated "OVERDRIVE A" is applied and then a very small value designated "OVERDRIVE B" is applied. FIG. 4B shows the internal structure of comparator 3, which includes a differential input stage 3A which drives the differential output stage 3B. Those skilled in the art will recognize that for the very low value of OVERDRIVE B, which in some cases might be only approximately Vref/65536 at the 16-bit accuracy level, the input stage 3A will drive output stage 3B much more slowly than if the much larger OVERDRIVE B is applied between the inputs of input stage 3A. Therefore, much more time must be allowed for comparator decisions at a high level of accuracy, e.g., at the 16-bit accuracy level, than is the case for comparator decisions at a lower accuracy level, e.g. at the 12 bit accuracy level. For example, for accuracy at the 16-bit level, the overdrive of the comparator input stage 3A for the "critical decision" is approximately 30 microvolts. At the 12 bit accuracy level, the comparator input stage overdrive for the critical decision is approximately 0.5 millivolts.

U.S. Pat. No. 4,620,179 (the '179 patent) by Cooper et al., assigned to Harris Corp., discloses a successive approximation analog-to-digital conversion technique that attempts to solve the above shortcomings of the prior art by providing an N bit SAR ADC wherein the first X bits are approximated to within less than the desired accuracy for N bits successive approximation and the remaining N-X bits are approximated to within at least the desired accuracy for N bit successive approximation. The '179 patent teaches that the error thereby introduced can be removed by performing an error correction operation. The '179 patent also teaches that there should be only one error correction cycle because each additional error correction operation cycle would require a significant increase in conversion time and yet afford only nominal improvement in conversion accuracy. Column 6, line 13 et seq. describe the technique for determining how many of bits of the N bit converter should be converted at full scale accuracy after which the single error correction cycle should be performed.

However, since there are three possible results of the error correction operation of the '179 patent, namely, incrementing the least significant bit, decrementing it, or performing no operation, it is not practical to perform the error correction operation in a single cycle. The '179 patent fails to recognize that in most cases, multiple error correction operation should be performed, and also fails to recognize that every error correction operation need not be performed at the final accuracy of the analog-to-digital converter, and instead teaches that multiple error correction operations are not advisable. Finally, the single error correction cycle described in the '179 patent requires too much time to perform and substantially reduces the advantage of the error correction process.

Thus, there is an unmet need for an improved way of operating an SAR ADC to provide substantially decreased analog-to-digital conversion time and reduced power consumption without substantially increasing complexity of the circuitry/architecture of the SAR ADC.

SUMMARY OF THE INVENTION

Accordingly, it is an object of the invention to provide an improved way of operating an SAR ADC so as to substantially decrease its analog-to-digital conversion time and/or substantially reduce its power consumption, without substantially increasing the complexity of the circuitry and without compromising on the accuracy of the SAR ADC.

It is another object of the invention to provide a technique for operating an SAR ADC which reduces the amount of time that must be allowed for a reference voltage amplifier to settle, which reduces the amount of time that must be allowed for internal CDAC charge redistribution, and which reduces the amount of time that must be allowed for comparator delay.

It is another object of the invention to provide a reduction of the analog-to-digital conversion time of an SAR ADC by at least a factor of 2 by changing its bit testing scheme, and without substantially changing the circuitry or architecture of the SAR.

It is another object of the invention to reduce the power dissipation of an SAR ADC primarily by changing its bit testing scheme, without reducing the analog-to-digital conversion time and without substantially changing the circuitry/architecture of the SAR ADC.

Briefly described, and in accordance with one embodiment, the present invention provides an SAR ADC which is operated by sampling an input voltage and redistributing a corresponding charge among a plurality of binarily weighted capacitors of a CDAC array to produce a representative voltage on a charge summing conductor. A successive approximation bit testing/conversion operation is performed at a first speed on a first group of bits, beginning with the MSB, to determine the bits of the first group with at least a first level of accuracy. A first error correction operation includes two cycles: performing a bit testing/conversion operation on a last bit of the first group and an incrementing or decrementing operation. Both are performed at a second speed which is lower than the first speed to determine the bits of the first group to at least a second level of accuracy which is more accurate than the first level of accuracy. Both the voltage on the charge summing conductor and the bits of the group are incremented or decremented as necessary to elevate the level of accuracy of the bits of the first group to at least the second level of accuracy. A similar successive approximation bit testing/conversion operation is performed at a lower second speed on a second group of bits to determine the bits of the second group with at least the second level of accuracy.

DETAILED DESCRIPTION OF THE PREFERRED EMBODIMENTS

According to the present invention, the entire SAR ADC conversion process is divided into a number of groups or "segments", for example, three segments, each performed at a successively lower speed but at a successively higher level of accuracy. At the end of each segment except the last one, an error correction operation (which requires two cycles) is performed. Testing and converting or resolving the bits of the "more significant" segments (i.e., the segments composed of the more significant bits of the DAC output code) at lower accuracy allows much faster successive approximation testing and conversion to determine the output bits of the more significant segments. Each error correction operation adds "redundancy" by correcting any dynamic errors made during testing/conversion of the bits of the present segment at reduced accuracy. (What is meant here by "redundancy" is that a code which was already tested at a higher speed and lower accuracy now is being retested, although at a lower speed and higher accuracy.)

The basic architecture of the SAR ADC of the present invention includes the prior art structure shown in FIG. 1, with the improvement that the SAR control logic circuit 15 further includes circuitry for grouping the successive approximation testing/conversions of the bits of the output word Dout into different segments having different associated speeds and levels of accuracy and for performing the error correction operations described herein.

The most significant, lower accuracy segments of the ADC bit testing/conversion procedure of the present invention can be performed at much higher speed than the higher accuracy segments because the requirements on the settling time of the reference voltage amplifier, the amount of time required for settling of the CDAC charge summing conductor, and the amount of comparator delay required to provide an accurate comparator output at the level of accuracy of the present segment is much less than is the case for higher accuracy, less significant segments of the ADC bit testing/conversion procedure. At the end of each low accuracy bit testing/conversion segment except the last one, an error correction operation is performed which results in a slower but higher accuracy testing/conversion of the bits of that segment. (Since the last segment is converted at the accuracy required by the converter, normally no error correction operation is required after the conversion of the last segment. However, if desired, the accuracy of the ADC could be increased beyond N bits (say to M bits) if an error correction operation were performed after the conversion of the last segment, followed by conversion of the remaining M-N bits at M bit accuracy.)

Figure 5:
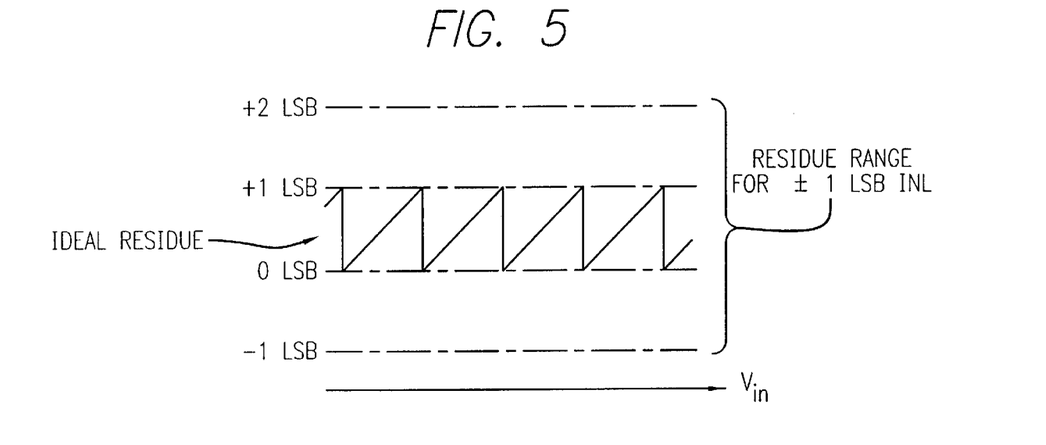
FIG. 5 graph useful in explaining accuracy, residue, and error correction in an SAR ADC according to the present invention.

Ideally, at the end of conversion for an N bit ADC, the error made (which is equal to the difference between the sampled input voltage and the final value of the "DAC voltage" $V_{7A}$) is within 0 and 1 lsb (1 lsb=Vref/$2^N$). This difference between the samples input voltage and the DAC voltage $V_{7A}$ is called the "Quantization Error". A practical ADC will, however, make an error over and above this quantization error. Generally, for a "true" N bit ADC, the final error of ±1 lsb over and above the quantization error is acceptable. This means that the total error can be −1 lsb to +2 lsb, and this is what is shown in FIG. 5.

In the described embodiment of the invention, since the first segment is run at a faster speed, it is possible that the ADC makes an error of ±1 lsb at the accuracy of that segment, which turns out to be a very large error for the ADC, which is supposed to convert at much higher accuracy. Therefore, this error has to be corrected. The assumption is made that the error is only due to dynamic effects, i.e., that the error is due primarily to the speed at which the first segment was converted.

The error correction operation has to be performed in two cycles for it to work properly. The first clock cycle identifies whether the correction, if necessary should be +ve or −ve, and the second cycle confirms it by applying and testing the correction. The error correction operations have to be performed at a slower speed (i.e., the bit testing/conversion speed of the next segment). By doing this, the constraint on the internal reference buffer is also greatly reduced, which is not recognized in the prior art. As indicated previously, prior art high-speed SAR ADC converters require an internal reference buffer, and the settling time constraint on this buffer is very stringent. In contrast, by using the above described segmented bit testing/conversion and error correction technique, this constraint is greatly relaxed since the first segment, wherein the reference buffer must drive the largest switching load, has a very relaxed accuracy requirement.

In the error correction operation, the last bit of the first segment is resolved at slower speed and at the accuracy of the second segment. If that last bit decision is "1", it indicates that the input voltage Vin is greater than the DAC output voltage $V_{7A}$. In that case, the error made in the code previously, if any, can only be in the −ve direction, between 0 and −1 lsb (at the accuracy of the first segment) band in FIG. 5). So, during the second cycle in the error correction operation, a "1" is added to the existing code and the result is re-tested. If the result still indicates that the input is greater than the DAC output voltage, then a "1" is added to the final output code. Otherwise, the code remains unchanged.

In conventional SAR architecture, a bit is always first tested by making it "1". If the result indicates that the DAC output voltage is more than the input voltage, the bit is reset to "0". The code after resetting the bit is never tested again to determine if the DAC output voltage is still more than the input voltage. So, if the last bit decision of the first segment is "0", in the second cycle of the error correction operation, the code is simply re-tested. If the comparator output at the end of the second cycle of the error correction operation still indicates that the input voltage is less than the DAC voltage, then a "1" is subtracted from the existing code.

It should be noted that the validity of the error correction operation depends on the correctness of the last bit decision. This decision determines whether the error made in the code before the error correction operation is +ve or −ve. If this decision is incorrect, the whole error correction operation will be ineffective. (or may even be counter-productive)

Figure 6:
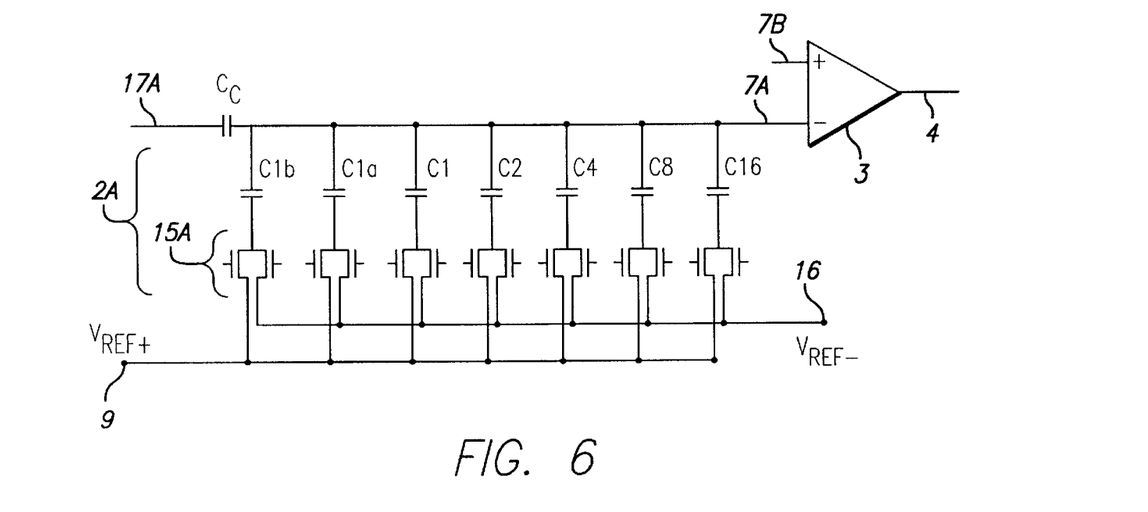
FIG. 6 is a schematic diagram useful in explaining an error correction technique in a high-speed SAR ADC according to the present invention.

Referring to FIG. 6, at the end of a segment of the successive approximation conversion process, the lower plates of binarily weighted capacitors C1, C2, C4, C8 and C16 are connected either to $V_{REF+}$ or $V_{REF-}$, depending on the value of the DAC code at that point in the conversion process. Also, capacitor C1$a$ can be selectively connected to either $V_{REF+}$ or $V_{REF-}$, and similarly, capacitor C1$b$ can be selectively connected to either $V_{REF+}$ or $V_{REF-}$. Capacitor $C_c$ is a coupling capacitor that typically couples another set of capacitors very similar to capacitors C1 to C16, C1$a$, and C1$b$ to charge summing conductor 7A. That set of capacitors functions as a DAC, and is used to sample the input voltage. A quantity corresponding to 1 LSB at the of accuracy of the first segment can be added to the voltage $V_{7A}$ on charge summing conductor 7A by switching the lower plate of capacitor C1$a$ from $V_{REF-}$ to $V_{REF+}$, and a quantity corresponding to 1 LSB at the of accuracy of the first segment can be subtracted from $V_{7A}$ by switching the lower plate of capacitor C1$b$ from $V_{REF+}$ to $V_{REF-}$. This is how a "1" is added or subtracted. (The same can also be achieved by incrementing or decrementing the code, but this could potentially change voltages at the bottom plates of all the capacitors in the first segment and cause a large transient which would be undesirable since the DAC has very limited time in which to settle. Additional pairs of similar correction capacitors (not shown) having capacitances less than the capacitances of correction capacitors C1$a$ and C1$b$ also are present to be similarly used to increment and decrement the charge summing conductor 7A and conductor 7B at the higher levels of accuracy required for the less significant segments of bits.

This error correction operation can be done at any time during the SAR conversion process. The weights of the various incrementing or decrementing capacitors would be equal to the weights of the last capacitor after which the error correction operation is to be performed. (For example of in FIG. 6, the capacitors C1$a$ and C1$b$ have the same capacitance as the capacitance of capacitor C1.)

Figure 7:
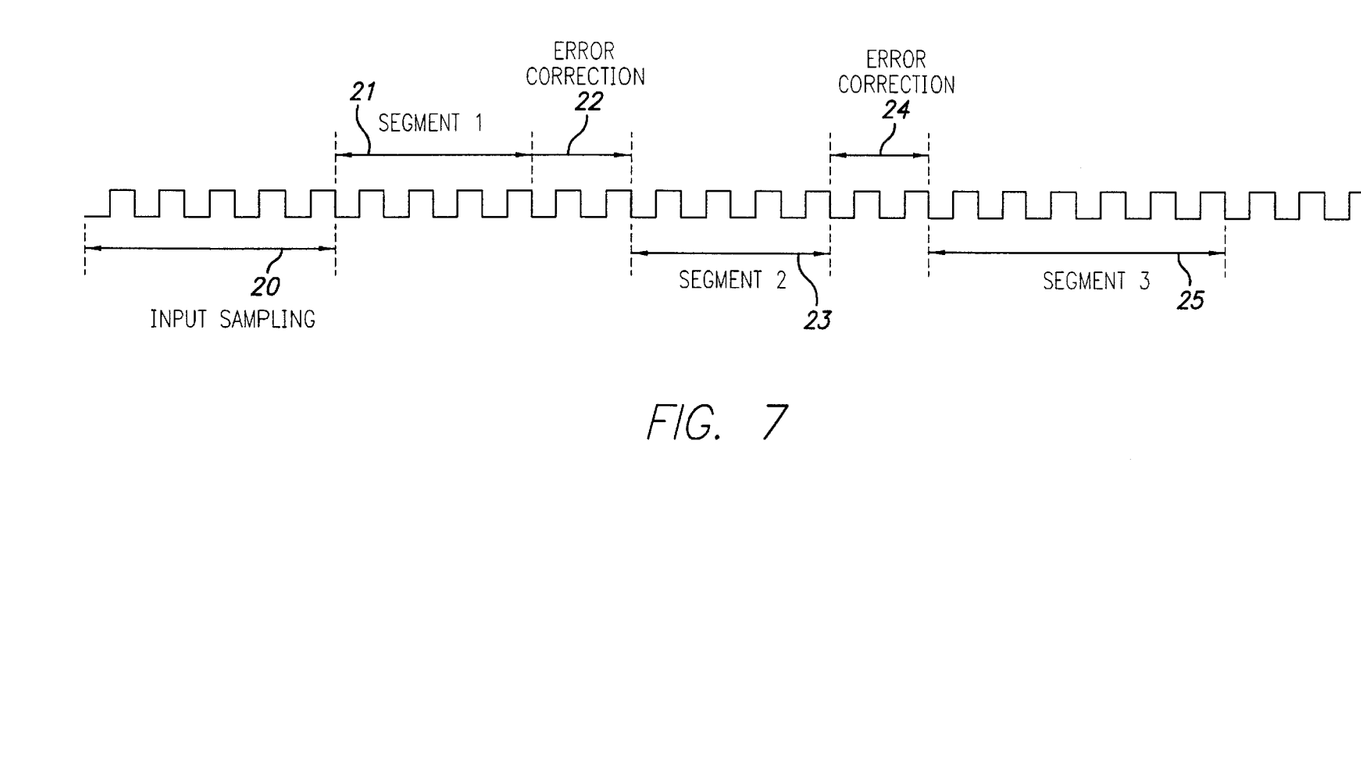
FIG. 7 is a timing diagram useful in explaining operation of the high-speed, low-power SAR ADC of the present invention.

FIG. 7 shows a timing diagram that illustrates a complete conversion of an analog input signal to a 16-bit output word by a SAR ADC, wherein the successive approximation bit testing/conversion procedure is segmented into 3 segments, including a first segment 21 ("Segment 1") in which the 4 most significant bits are sequentially tested at the 5 bit accuracy level. Then, during interval 22, a first error correction operation is performed at the 10 bit accuracy level, to elevate the accuracy of the results of the testing/conversion of the first 5 bits at the 5 bit accuracy level to the 10 bit accuracy level. The next 4 bit testing decisions then are performed in the second segment 23 ("Segment 2") at the 10 bit accuracy level, followed by a second error correction operation during interval 24, to elevate the accuracy to the 16-bit level. The final 6 bit testing decisions are performed in the third segment 23 (Segment 3") at the 16-bit accuracy level, so the entire 16-bit output word to which the analog input is converted achieves a 16-bit accuracy level.

Note that a different number of segments of various numbers of bits could be used instead, to similarly achieve a fast, low power analog-to-digital conversion at the 16-bit accuracy level, depending on comparator constraints and other architectural issues. (For example, the first segment could test the first 5 bits, rather than the first 4 bits.) The determination of how many segments to use and how many bits to include in each segment for particular application involves a trade-off between how much time is gained in the testing/conversion of the bits of each segment versus the amount of time required for error correction operation of that segment. If a segment is made too large (i.e., too many bits) the advantage of segmenting is lost, whereas if the segment is made too small, too many error correction decisions will be required, which means that more complex digital logic and that more correction capacitors such as C1$a$ and C1$b$ (FIG. 6) would be required for error correction.

Since the first 4 conversions shown in FIG. 7 are at the 5-bit accuracy level, they can be performed at a much faster rate than if they are performed at the 16-bit accuracy level. In a particular CMOS technology, each of the first 5 bit testing/conversion operations can be accomplished in about 8 nanoseconds. In the same CMOS technology, bit testing/conversion at the 16-bit accuracy level requires approximately 35 nanoseconds. Thus, the bit testing/conversion of a segment at the lower accuracy results in a substantial reduction in the conversion time of the first 5 conversions that constitute Segment 1, and hence results in a corresponding substantial reduction in the total conversion time. For the 5 conversions of Segment 2, which are performed at the 10 bit accuracy level, each bit testing/conversion requires about 15 nanoseconds for an implementation in the CMOS technology referred to above. The last 6 bit testing/conversion operations that constitute Segment 3 are performed at the 16-bit accuracy level, and require approximately 30 nanoseconds for each of the 6 bit testing/conversion operations.

Therefore, the total conversion time can be represented by the following equation:

$$Tcycle = Tsample + 4*8\ ns + 2*15\ ns + 4*15\ ns + 2*30\ ns + 6*30\ ns. \quad \text{Eq. (1)}$$

If ErrorCycle1 requires to 30 nanoseconds (ns), and ErrorCycle2 requires 60 nanoseconds, then $$Tcycle = Tsample + 362\ ns.$$

This would be much faster than the conversion time of a conventional 16-bit SAR ADC, which requires approximately 35 nanoseconds for each bit testing/conversion process (Tcycle=Tsample+560 ns).

One of the biggest advantages of this scheme, other than achieving higher speed is that it relaxes constraints on the comparator and the reference buffer inside the device, thereby reducing the power dissipation.

Typically, the settling constraints on the reference buffer are most stringent during the first few decisions when the switching capacitor load is maximum. The larger the switching load, the more is the settling time required for the buffer with the same bandwidth. In FIG. 6 for example, C16 is 16 times larger than C1. If the buffer is designed with a switch capacitor load of C16, it will need a much larger bandwidth. This bandwidth is not of much use in the later decisions since the load is too small. In the suggested scheme, since the first segment needs to have much lesser accuracy, the reference buffer needs to settle only to that accuracy. This relaxes the buffer bandwidth requirements to a great extent.

The same is the case with the comparator. Since the first segment has to be resolved at a lesser accuracy, the comparator can be optimized for maximum speed at this accuracy. For more accurate decisions later, a separate comparator can be used.

Thus, the described SAR ADC architecture performs testing/conversion of the bits of the output word into segments which are tested at higher speed but lower accuracy than is required for the complete conversion, and also performs an error correction operation after testing the least significant bit of each segment to correct any errors that may have been made up to that point. The bits of the first segment are the most significant bits, and are tested at the highest speed and the lowest accuracy level, and an error correction operation is performed. Then the bits of the second segment, which are less significant, are tested at a lower speed but higher accuracy level, and another error correction operation is performed, and so on. The bits of the last segment are tested at the lowest speed, and at the high accuracy level required for the complete analog-to-digital conversion. The speeds of the testing/conversion of the bits in each segment are determined by the rates at which the outputs of the comparator are "accepted" for the respective segments, so the total conversion time is substantially reduced over that of a conventional SAR ADC. The low accuracy required for testing of bits, especially the first few bits, of the first segment requires the reference voltage amplifier to rapidly settle only to the relatively high voltage level corresponding to the low accuracy, and thereby saves a great deal of time.

The high power dissipation required to provide the high bandwidth needed for faster settling of the reference voltage amplifier for the prior art is avoided, and the amount of power dissipation and cost of an on-chip buffer circuit between the bonding wire inductance and the internal reference voltage conductor also are avoided. The need to reduce prior art comparator delay by increasing power dissipation of the comparator to increase bandwidth also is avoided.

While the invention has been described with reference to several particular embodiments thereof, those skilled in the art will be able to make the various modifications to the described embodiments of the invention without departing from the true spirit and scope of the invention. It is intended that all elements or steps which are insubstantially different or perform substantially the same function in substantially the same way to achieve the same result as what is claimed are within the scope of the invention.

What is claimed:

1. A method of operating a SAR ADC, comprising:
    (a) sampling an input voltage and redistributing a corresponding charge among a coupling capacitance and a plurality of binarily weighted capacitors of a CDAC array of the SAR ADC to produce a first voltage on a charge summing conductor;
    (b) performing a successive approximation bit testing/conversion operation at a first speed and at a first level of accuracy on at least each bit except a least significant bit of a first group of bits of an output word, beginning with a most significant bit of the first group, to determine whether at least each bit except the least significant bit of the first group is a "1" or a "0";
    (c) performing an error correction operation at a second speed, the error correction operation including performing a bit testing/conversion operation on the least significant bit of the first group to determine whether a value of the least significant bit of the first group is a "1" or a "0" and performing an incrementing/decrementing operation to determine a value of the bits of the first group to at least a second level of accuracy which is more accurate than the first level of accuracy, and incrementing or decrementing both the voltage on the charge summing conductor and the least significant bit of the first group as necessary to elevate the level of accuracy of the bits of the first group to at least the second level of accuracy.

2. The method of claim 1 wherein the first level of accuracy corresponds to the significance within the output word of the least significant bit of the first group of bits.

3. A method of operating an SAR ADC to convert an analog input voltage to an output word including N bits including a most significant bit, comprising:
    (a) sampling the analog input voltage and redistributing a charge representative of the sampled analog input voltage among a coupling capacitance and a plurality of binarily weighted capacitors of a CDAC array to produce a voltage on a charge summing conductor;
    (b) performing a successive approximation bit testing/conversion operation at a first speed for each bit except a least significant bit of a first group of M bits of the output word, beginning with the MSB, to determine with at least a first level of accuracy whether each bit except the least significant bit of the first group is a "1" or a "0", where M and N are integers and M is less than N;
    (c) performing an error correction operation at a second speed, the error correction operation including performing a bit testing/conversion operation on the least significant bit of the first group at a second speed which is lower than the first speed to determine whether a value of the least significant bit of the first group is a "1" or a "0" and then performing an incrementing/decrementing operation to determine a value of the bits of the first group to at least a second level of accuracy which is more accurate than the first level of accuracy, and incrementing or decrementing the least significant bit of the first group as necessary to elevate the level of accuracy of the bits of the first group to the second level of accuracy, and correspondingly incrementing or decrementing the voltage on the charge summing conductor.

4. The method of claim 3 including providing first and second correction capacitors each having a first terminal connected to the charge summing conductor and each also having a second terminal, wherein the incrementing of the voltage on the charge summing conductor is performed by switching the second terminal of the first capacitor from a first reference voltage to a second reference voltage, and wherein the decrementing of the voltage on the charge summing conductor is performed by switching the second terminal of the second capacitor from the second reference voltage to the first reference voltage.

5. The method of claim 4 wherein the first and second correction capacitors each have a capacitance which transfers an amount of charge into or out of the charge summing conductor so as to cause incrementing or decrementing of the voltage on the charge summing conductor by an amount equal to 1 LSB at the first level of accuracy.

6. A method of increasing the speed of operation of an SAR ADC to convert an analog input voltage to an output word including N bits including a most significant bit, comprising:
   (a) sampling the analog input voltage and redistributing a charge representative of the sampled analog input voltage among a coupling capacitance and a plurality of binarily weighted capacitors of a CDAC array to produce a voltage on a charge summing conductor;
   (b) performing a successive approximation bit testing/conversion operation at a first speed for each bit except a least significant bit of a first group of M bits of the output word, beginning with the MSB, to determine with at least a first level of accuracy whether each bit except the least significant bit of the first group is a "1" or a "0", where M and N are integers and M is less than N; and
   (c) performing an error correction operation at a second speed, the error correction operation including performing a bit testing/conversion operation on the least significant bit of the first group at a second speed which is lower than the first speed to determine whether a value of the least significant bit of the first group is a "1" or a "0" and then performing an incrementing/decrementing operation to determine a value of the bits of the first group to at least a second level of accuracy which is more accurate than the first level of accuracy, and incrementing or decrementing the least significant bit of the first group as necessary to elevate the level of accuracy of the bits of the first group to the second level of accuracy, and correspondingly incrementing or decrementing the voltage on the charge summing conductor.

7. A method of operating an SAR ADC to convert an analog input voltage to an output word including N bits including a most significant bit, comprising:
   (a) sampling the analog input voltage and redistributing a charge representative of the sampled analog input voltage among a coupling capacitance and a plurality of binarily weighted capacitors of a CDAC array to produce a voltage on a charge summing conductor;
   (b) performing a successive approximation bit testing/conversion operation at a first speed for each of a first number of bits constituting a first group of M bits of the output word except a least significant bit of the first group, beginning with the most significant bit of the output word, to determine values of the bits except the least significant bit of the first group with at least a first level of accuracy, wherein M and N are integers and M is less than N;
   (c) performing an error correction operation at a second speed which is lower than the first speed, the error correction operation including performing a bit testing/conversion operation on the least significant bit of the first group to determine whether a value of the least significant bit of the first group is a "1" or a "0" and then performing an incrementing/decrementing operation to determine a value of the bits of the first group to at least a second level of accuracy which is more accurate than the first level of accuracy, and incrementing or decrementing the least significant bit of the first group as necessary to elevate the level of accuracy of the bits of the first group to the second level of accuracy, and correspondingly incrementing or decrementing the voltage on the charge summing conductor; and
   (d) performing the successive approximation bit testing/conversion operation on at least some of the remaining N-M bits at a speed which is lower than the first speed at an accuracy that is at least as accurate as the second level of accuracy.

8. A method of operating an SAR ADC to convert an analog input voltage to an output word including N bits including a most significant bit, comprising:
   (a) sampling the analog input voltage and redistributing a charge representative of the sampled analog input voltage among a coupling capacitance and a plurality of binarily weighted capacitors of a CDAC array to produce a voltage on a charge summing conductor;
   (b) performing a successive approximation bit testing/conversion operation at a first speed for each of a first number of bits constituting a first group of bits of the output word except a least significant bit of the first group, beginning with the most significant bit of the output word, to determine with at least a first level of accuracy whether each bit except the least significant bit of the first group is a "1" or a "0";
   (c) performing an error correction operation at a second speed which is lower than the first speed, the error correction operation including performing a bit testing/conversion operation on a least significant bit of the first group to determine whether a value of the least significant bit of the first group is a "1" or a "0" and then performing an incrementing/decrementing operation to determine a value of the bits of the first group to at least a second level of accuracy which is more accurate than the first level of accuracy, and incrementing or decrementing the least significant bit of the first group as necessary to elevate the level of accuracy of the bits of the first group to at least the second level of accuracy, and correspondingly incrementing or decrementing the voltage on the charge summing conductor; and
   (d) for each of a second number of bits constituting a second group of bits of the output word, beginning with a most significant bit in the second group, performing a successive approximation bit testing/conversion operation at a second speed to determine values of the bits of the second group with at the second level of accuracy.

9. The method of claim 8 wherein the first level of accuracy corresponds to the significance within the output word of the least significant bit of the first group.

10. The method of claim 8 wherein the first group of bits and the second group of bits constitute the entire output word.

11. The method of claim 10 wherein N is equal to 16, the first number of bits is equal to 6 bits.

12. The method of claim 8 including relaxing a speed/power constraint on a reference buffer providing a reference voltage utilized in performing the bit testing/conversion operations of steps (b) and (c).

13. A method of operating an SAR ADC to convert an analog input voltage to an output word including N bits including a most significant bit, comprising:

(a) sampling the analog input voltage and redistributing a charge representative of the sampled analog input voltage among a coupling capacitance and a plurality of binarily weighted capacitors of a CDAC array to produce a voltage on a charge summing conductor;

(b) performing a successive approximation bit testing/conversion operation at a first speed and at a first level of accuracy on each bit except a least significant bit of a first group of bits of the output word, beginning with a most significant bit of the first group, to determine with a first level of accuracy whether each bit except the least significant bit of the first group is a "1" or a "0";

(c) performing an error correction operation at a second speed which is lower than the first speed, the error correction operation including performing a bit testing/conversion operation on the least significant bit of the first group to determine whether a value of the least significant bit of the first group is a "1" or a "0" and then performing an incrementing/decrementing operation to determine a value of the bits of the first group to at least a second level of accuracy which is more accurate than the first level of accuracy, and incrementing or decrementing the least significant bit of the first group as necessary to elevate the level of accuracy of the bits of the first group to the second level of accuracy, and correspondingly incrementing or decrementing the voltage on the charge summing conductor;

(d) for each of a second number of bits constituting a second group of bits of the output word except a least significant bit of the second group, beginning with a most significant bit of the second group, performing the successive approximation bit testing/conversion operation at a second speed and at the second level of accuracy on each bit except a least significant bit of the second group, beginning with a most significant bit of the second group, to determine with the second level of accuracy whether each bit except the least significant bit of the second group is a "1" or a "0";

(e) performing the bit testing/conversion operation on the least significant bit of the second group at a third speed which is lower than the second speed to determine whether a value of the least significant bit of the second group is a "1" or a "0" and then performing an error correction operation to determine a value of the bits of the second group to at least a third level of accuracy which is more accurate than the second level of accuracy, and incrementing or decrementing the least significant bit of the first group as necessary to elevate the level of accuracy of the bits of the second group to the third level of accuracy, and correspondingly incrementing or decrementing the voltage on the charge summing conductor.

14. The method of claim 13 wherein the first level of accuracy corresponds to the significance of the least significant bit of the first group within the output word, and the second level of accuracy corresponds to the significance of the least significant bit of the second group within the output word.

15. The method of claim 14 wherein the third level of accuracy corresponds to the significance of the least significant bit of the output word.

16. The method of claim 13 including providing first and second correction capacitors each having a first terminal connected to the charge summing conductor and each also having a second terminal, wherein the incrementing of the voltage on the charge summing conductor is performed by switching the second terminal of the first capacitor from a first reference voltage to a second reference voltage, and wherein the decrementing of the voltage on the charge summing conductor is performed by switching the second terminal of the second capacitor from the second reference voltage to the first reference voltage.

17. The method of claim 16 wherein the first correction capacitor has a capacitance which transfers an amount of charge into or out of the charge summing conductor so as to cause the incrementing of the voltage on the charge summing conductor recited in step (c) by an amount equal to 1 LSB at the second level of accuracy, and wherein the second correction capacitor has a capacitance which transfers an amount of charge into or out of the charge summing conductor so as to cause the-decrementing of the voltage on the charge summing conductor recited in step (e) by an amount equal to 1 LSB at the third second level of accuracy.

18. The method of claim 13 wherein N is equal to 16, the first number of bits is equal to 5 bits, the first level of accuracy is a 5 bit level of accuracy, the second number of bits is equal to 5 bits and the second level of accuracy is a 10 bit level of accuracy, and the third level of accuracy is a 16 bit level of accuracy.

19. The method of claim 13 including performing a successive approximation bit testing/conversion operation at a third speed slower than the second speed for each of a third number of bits constituting a third group of bits of the output word, beginning with a most significant bit in the third group, to determine values of the bits of the third group with at least the third level of accuracy.

20. The method of claim 19 wherein the first, second and third groups of bits constitute the N bits.

21. An SAR ADC for converting an analog input voltage to an output word including N bits including a most significant bit, comprising:

(a) a sampling capacitance for coupling the analog input voltage;

(b) a CDAC capacitor array for receiving and redistributing a charge representative of the sampled analog input voltage among the coupling capacitor and a plurality of binarily weighted capacitors of a CDAC array to produce a first voltage on a charge summing conductor;

(c) a comparator having a first input coupled to the charge summing conductor and a second input coupled to receive a reference voltage;

(d) SAR control circuitry coupled to an output of the comparator to perform a successive approximation bit testing/conversion operation at a first speed and at a first level of accuracy on each bit except a least significant bit of a first group of bits of the output word, beginning with a most significant bit of the first group, to determine whether each bit except the least significant bit of the first group is a "1" or a "0";

(e) the SAR control circuitry being operative to perform an error correction operation at a second speed which is lower than the first speed, the error correction operation including performing a bit testing/conversion operation on the least significant bit of the first group to determine whether a value of the least significant bit of the first group is a "1" or a "0" and then performing an incrementing/decrementing operation to determine a value of the bits of the first group to at least a second level of accuracy which is more accurate than the first level of accuracy, and to increment or decrement the least significant bit of the first group as necessary to elevate the level of accuracy of the bits of the first group to the second level of accuracy and correspondingly increment or decrement the voltage on the charge summing conductor.

22. The SAR ADC of claim 21 including first and second capacitors each having a first terminal connected to the charge summing conductor and also having a second terminal, and a first switch coupled between the second terminal of the first capacitor and a first reference voltage, a second switch coupled between the second terminal of the first capacitor and a second reference voltage, a third switch coupled between the second terminal of the second capacitor and the first reference voltage, and a fourth switch coupled between the second terminal of the second capacitor and the second reference voltage, wherein the incrementing of the voltage on the charge summing conductor is performed by switching the second terminal of the first capacitor from the second reference voltage to the first reference voltage, and wherein the decrementing of the voltage on the charge summing conductor is performed by switching the second terminal of the second capacitor from the first reference voltage to the second reference voltage.

23. The SAR ADC of claim 22 wherein the capacitor has a capacitance which transfers an amount of charge into or out of the charge summing conductor so as to cause incrementing or decrementing the voltage on the charge summing conductor by an amount equal to 1 LSB at the second level of accuracy.

24. An SAR ADC for converting an analog input voltage to an output word including N bits including a most significant bit, comprising:

(a) a coupling capacitance for sampling the analog input voltage;

(b) a CDAC capacitor array for receiving and redistributing a charge representative of the sampled analog input voltage among the coupling capacitor and a plurality of binarily weighted capacitors of a CDAC array to produce a first voltage on a charge summing conductor;

(c) a comparator having a first input coupled to the charge summing conductor and a second input coupled to receive a reference voltage;

(d) SAR control circuitry coupled to an output of the comparator to perform a successive approximation bit testing/conversion operation at a first speed and at a first level of accuracy on each bit except a least significant bit of a first group of bits of the output word, beginning with a most significant bit of the first group, to determine whether each bit except the least significant bit of the first group is a "1" or a "0";

(e) the SAR control circuitry being operative to perform an error correction operation at a second speed which is lower than the first speed, the error correction operation including performing a bit testing/conversion operation on the least significant bit of the first group at a second speed which is lower than the first speed to determine whether a value of the least significant bit of the first group is a "1" or a "0" and then perform an incrementing/decrementing operation to determine a value of the bits of the first group to at least a second level of accuracy which is more accurate than the first level of accuracy, and to increment or decrement the least significant bit of the first group as necessary to elevate the level of accuracy of the bits of the first group to the second level of accuracy and correspondingly increment or decrement the voltage on the charge summing conductor;

(f) the SAR control circuitry being operative to perform the successive approximation bit testing/conversion operation at the second speed and at the second level of accuracy on each bit except a least significant bit of a second group of bits of the output word, beginning with a most significant bit of the second group, to determine whether each bit except the least significant bit of the second group is a "1" or a "0";

(g) the SAR control circuitry being operative to perform the error correction operation at a third speed which is lower than the second speed, the error correction operation including performing the bit testing/conversion operation on the least significant bit of the second group to determine whether a value of the least significant bit of the second group is a "1" or a "0" and then perform an incrementing/decrementing operation to determine a value of the bits of the second group to at least a third level of accuracy which is more accurate than the second level of accuracy, and to increment or decrement the least significant bit of the first group as necessary to elevate the level of accuracy of the bits of the second group to the third level of accuracy and correspondingly increment or decrement the voltage on the charge summing conductor.

25. The SAR ADC of claim 24 including first and second capacitors each having a first terminal connected to the charge summing conductor and also having a second terminal, and a first switch coupled between the second terminal of the first capacitor and a first reference voltage, a second switch coupled between the second terminal of the first capacitor and a second reference voltage, a third switch coupled between the second terminal of the second capacitor and the first reference voltage, and a fourth switch coupled between the second terminal of the second capacitor and the second reference voltage, wherein the incrementing of the voltage on the charge summing conductor is performed by switching the second terminal of the first capacitor from the second reference voltage to the first reference voltage, and wherein the decrementing of the voltage on the charge summing conductor is performed by switching the second terminal of the second capacitor from the first reference voltage to the second reference voltage.

26. The SAR ADC of claim 25 wherein the first correction capacitor has a capacitance which transfers an amount of charge into or out of the charge summing conductor during the first error correction operation so as to cause incrementing or decrementing the voltage on the charge summing conductor by an amount equal to 1 LSB at the second level of accuracy, and wherein the second correction capacitor has a capacitance which transfers an amount of charge into or out of the charge summing conductor during the second error correction operation so as to cause incrementing or decrementing the voltage on the charge summing conductor by an amount equal to 1 LSB at the third level of accuracy.

27. The SAR ADC of claim 24 wherein the reference voltage is produced by a dummy CDAC array for receiving and redistributing a charge representative of the sampled analog input voltage among the dummy coupling capacitor and a plurality of binarily weighted capacitors of the dummy CDAC array to produce the reference voltage on a dummy charge summing conductor.

28. An SAR ADC for converting an analog input voltage to an output word including N bits including an MSB, comprising:
   (a) means for sampling the analog input voltage and redistributing a charge representative of the sampled analog input voltage among a coupling capacitor and a plurality of binarily weighted capacitors of a CDAC array to produce a first voltage on a charge summing conductor;
   (b) means for performing a successive approximation bit testing/conversion operation at a first speed for each of a first number of bits constituting a first group of bits of the output word, beginning with a most significant bit of the first group to determine values of the bits of the first group with a first level of accuracy;
   (c) means for performing an error correction operation at a second speed which is lower than the first speed, the error correction operation including performing a first error correction operation by performing a bit testing/conversion operation on a least significant bit of the first group to determine a value of the bits of the first group with a second level of accuracy which is more accurate than the first level of accuracy; and
   (d) means for incrementing or decrementing the bits of the first group as necessary to elevate the level of accuracy of bits of the first group to the second level of accuracy and correspondingly incrementing or decrementing the voltage on the charge summing conductor.

* * * * *